(12) United States Patent
Lin

(10) Patent No.: US 6,381,295 B1
(45) Date of Patent: Apr. 30, 2002

(54) SHIFTER WITH OVERFLOW DETECTION MECHANISM

(75) Inventor: Rehn-Lieh Lin, Hsinchu (TW)

(73) Assignee: Windbond Electronics Corp. (TW)

(*) Notice: Subject to any disclaimer, the term of this patent is extended or adjusted under 35 U.S.C. 154(b) by 0 days.

(21) Appl. No.: 09/834,453

(22) Filed: Apr. 13, 2001

(51) Int. Cl.[7] .................................................. G11C 19/00

(52) U.S. Cl. .............................. 377/69; 377/72; 377/75

(58) Field of Search ................................ 377/69, 72, 75

(56) References Cited

U.S. PATENT DOCUMENTS 6,058,473 A * 5/2000 Guttag et al. ................ 712/225

* cited by examiner

Primary Examiner—Margaret R. Wambach
(74) Attorney, Agent, or Firm—Raymond Sun

(57) ABSTRACT

An apparatus that performs a left shift operation includes a shifter unit that contains the value to be shifted, a flag having an input coupled to the left-most bit of the shifter unit for receiving sign bit information for the value to be shifted, an overflow detector having inputs coupled to the shifter unit and the flag for determining the existence of an overflow condition, and a shift counter having outputs coupled to the shifter unit and the overflow detector.

11 Claims, 2 Drawing Sheets

SHIFTER WITH OVERFLOW DETECTION MECHANISM

BACKGROUND OF THE INVENTION

1. Field of the Invention

The present invention relates generally to a shifter that can detect overflow conditions in a speedy manner.

2. Background Art

Conventional shifters can be used in a number of different applications. One common application is digital signal processing (DSP), which is commonly used in video conferencing. In performing DSP, analog data (e.g., representing speech) is converted to digital data. During this conversion, an algorithm is usually applied to perform data compression, and a shifter is normally used in this compression algorithm.

Conventional shifters operate by performing left-shift and right-shift operations. Referring to FIG. 1, the sign bit of the shifted value is usually contained in the left-most bit or location of a shift register where the shifting is performed. During a right-shift operation, the sign bit still exists. However, during a left-shift operation, the sign bit is shifted away. As a result, during left-shift operations, it is not possible to determine whether the sign bit has changed. Unfortunately, the status of the sign bit is important in detecting the occurrence of overflow, since overflow occurs either when the sign bit has been shifted away, or when the sign bit has changed. Thus, conventional shifters were not fully capable of detecting overflow conditions, and of performing optimal saturation operations. As used herein, saturation means that when overflow occurs, the result is set to the most-positive or most-negative values depending on the direction of overflow.

To overcome this shortcoming, efforts were made to detect overflow by using multiplication and accumulation operations, since the multiply and accumulate operations have an overflow flag reporting mechanism. Unfortunately, the multiply and accumulate operations require significantly more processing time, which will slow down the shifting operation and reduce the performance of the system. For example, to left shift a 32-bit value by n bits using a multiplier and adder will require eight instructions to perform a single left shift with overflow detection and saturate the result. On the other hand, a left shift performed by a conventional 32-bit shifter will only require two instructions.

Thus, there still remains a need for a shifter that can detect overflow conditions and perform saturation operations in a speedy manner while avoiding the problems experienced by known shifters.

SUMMARY OF THE INVENTION

It is an object of the present invention to provide a shifter that can speed up the shifting operation while being able to effectively detect overflow conditions.

It is another object of the present invention to provide a shifter that can effectively perform saturation operations upon the detection of an overflow condition.

To accomplish the objectives of the present invention, there is provided an apparatus for performing a left shift operation that includes a shifter unit that contains the value to be shifted, a flag having an input coupled to the left-most bit of the shifter unit for receiving sign bit information for the value to be shifted, an overflow detector having inputs coupled to the shifter unit and the flag for determining the existence of an overflow condition, and a shift counter having outputs coupled to the shifter unit and the overflow detector.

According to one embodiment of the present invention, the apparatus further includes a saturation circuit having inputs coupled to the flag and the overflow detector, and an output coupled to the shifter unit.

The present invention further provides a method of performing a left-shift operation, which includes a. loading a value to be shifted into a shifter unit, the shifter unit having a first left-most bit containing sign bit information for the value to be shifted, and a second bit adjacent to the first bit;

b. shifting the value by one bit to the left;

c. comparing the data in the first and second bits; and d. setting an overflow condition if the data in the first and second bits are not the same.

BRIEF DESCRIPTION OF THE DRAWINGS

The invention can be more fully understood by reading the subsequent detailed description of the preferred embodiments, with reference made to the accompanying drawings.

DETAILED DESCRIPTION OF THE INVENTION

In the following description, for purposes of explanation and not limitation, specific details are set forth in order to provide a thorough understanding of the present invention. However, it will be apparent to one skilled in the art that the present invention may be practiced in other embodiments that depart from these specific details. In certain instances, detailed descriptions of well-known or conventional data processing techniques, hardware devices and circuits are omitted so as to not obscure the description of the present invention with unnecessary detail.

Figure 1:
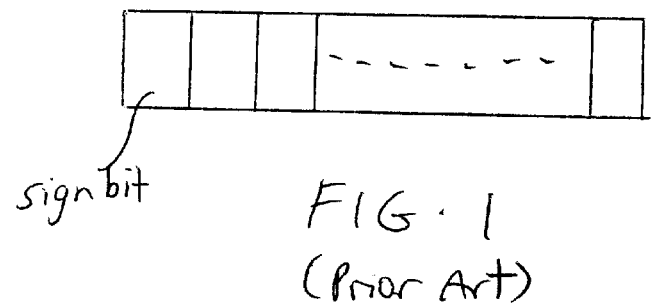
FIG. 1 illustrates a conventional shift register that can be using for shifting operations.
Figure 2:
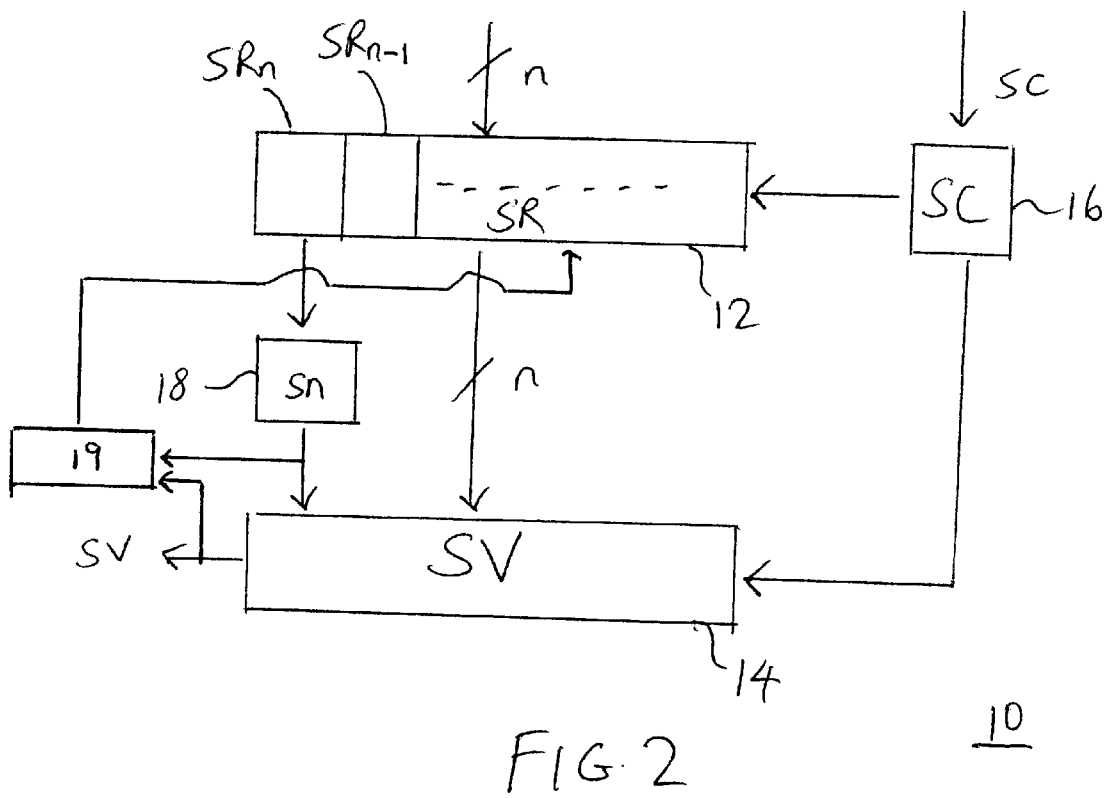
FIG. 2 is a schematic block diagram of a shifter according to the present invention.

FIG. 1 illustrates a shifter 10 according to one embodiment of the present invention. The shifter 10 can be implemented inside a DSP or general purpose processor that can be used in performing DSP. The shifter includes a shifter unit SR 12 (which can be a shift register), an overflow detector SV 14 (which can be another shift register or an XOR circuit), a shift counter SC 16 (which can be a register), a flag sn 18 (which can also be a register), and a saturation circuit 19. The shifter unit 12 can be a register of the processor, and the number or value to be shifted is loaded into the shifter unit 12 by a processor instruction. The shifter unit 12 also receives the shift count from the shift counter 16. The shift count sc is provided to the shift counter 16 by a processor instruction. The flag 18 is coupled to the leftmost bit in the shifter unit 12 to receive the sign bit. The number or value to be shifted (from the shifter unit 12), the sign bit sn (from the flag 18), and the shift count (from the shift counter 16), are provided to the overflow detector 14, which outputs a value sv that indicates whether an overflow has been detected. The value sv is a hardwire (H/W) flag that indicates the overflow status. The saturation circuit 19 has inputs coupled to the flag sn 18 and the overflow detector 14 (to receive the value sv), and has an output coupled to the shifter unit 12. The saturation circuit 19 performs the saturation operation, as described below, and can be another H/W circuit. The value n in FIG. 2 indicates the length of the shifter unit 12.

Figure 3:
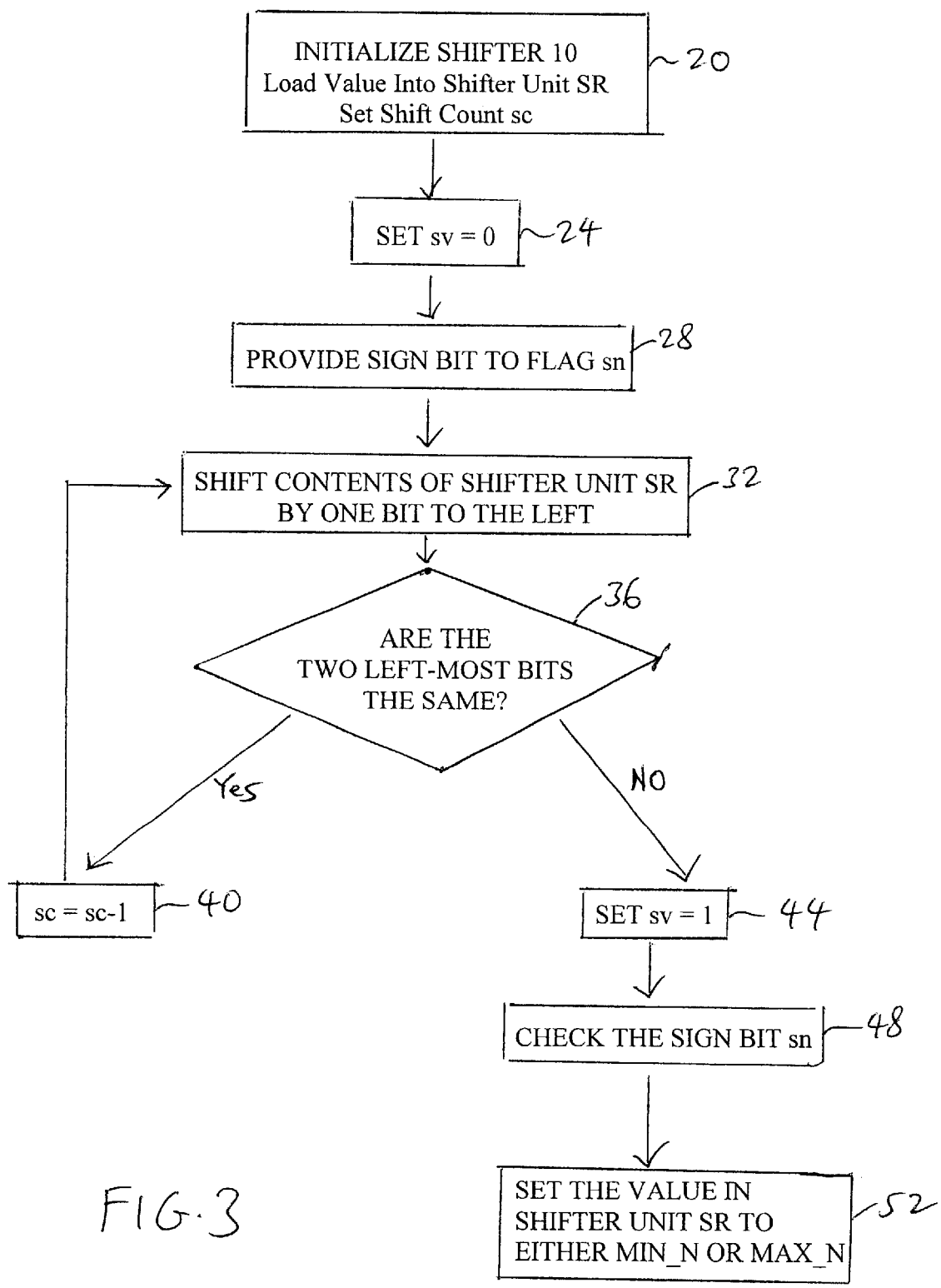
FIG. 3 is a flowchart which illustrates the basic operational steps of the shifter of FIG. 2.

The shifter 10 can be operated using the following procedure for performing left-shift operations, as shown in FIG. 3. First, in step 20, the various elements in the shifter 10 are initialized. For example, the number or value to be shifted is loaded into the shifter unit 12, and the shift count sc is set. As explained above, these are performed by processor instructions. The contents in the shifter 10 will contain 0's and 1's, which together represent the value to be shifted. Next, in step 24, the value of sv from the overflow detector 14 is set to zero. At this time, the shifting operation can begin. In step 28, the flag 18 receives, from the left-most bit ($SR_n$) of the shifter unit 12, the sign bit of the value to be shifted. Next, in step 32, the contents of the shifter unit 12 are shifted by one bit to the left. In step 36, an exclusive-or (XOR) operation is performed on the left-most bit ($SR_n$) and the bit ($SR_{n-1}$) adjacent the left-most bit ($SR_n$) to determine whether they are the same. This XOR operation is performed by the overflow detector 14, which can include an XOR circuit. Referring now to decision block 36, if the result of the XOR operation is a "1" (i.e., $SR_n$ and $SR_{n-1}$ are not the same), then an overflow condition has occurred, the shifter 10 exits the shifting operation by proceeding to step 44. On the other hand, if the result of the XOR operation is a "0" (i.e., $SR_n$ and $SR_{n-1}$ are the same, and sv="0"), then no overflow condition has occurred, and processing proceeds to step 40.

In step 40, it is possible to decrease the shift count sc by 1, after which processing returns to step 32.

When the shifter 10 exits the shifting operation, saturation is performed by the saturation circuit 19. First, in step 44, the value of sv is set to "1" and then in step 48, the value of the sign bit sn is checked by the saturation circuit 19. Since an overflow condition has occurred, in step 52, the saturation circuit 19 sets the value in the shifter unit 12 to either the MAX_N value, or the MIN_N value, which is n bits of "FFFF . . . F" representing n bits of "1". The MIN_N value represents the minimum number of the shifter unit 12, while the MAX_N value represents the maximum number of the shifter unit 12, and both of these values can be pre-defined. If the original value of the sign bit was 1 (i.e., negative), then the value in the shifter unit 12 is set to the MIN_N value. Otherwise, if the original value of the sign bit was 0 (i.e., positive), then the value in the shifter unit 12 is set to the MAX_N value. For example, for a 16-bit processor, MAX_N would be "0111 1111 1111 1111" and MIN_N would be "1111 1111 1111 1111". Processing then terminates.

Thus, the present invention provides an overflow detector 14 and a sign bit flag 18 that operate to detect overflow conditions during a normal left-shift operation, thereby allowing for the shifting operation to be performed quickly and without imposing on the processing capabilities of the system.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. An apparatus for performing a left shift operation, comprising:

a shifter unit having a left-most bit, the shifter unit containing the value to be shifted;

a flag having an input coupled to the left-most bit of the shifter unit for receiving sign bit information for the value to be shifted;

an overflow detector having inputs coupled to the shifter unit and the flag for determining the existence of an overflow condition; and a shift counter having outputs coupled to the shifter unit and the overflow detector.

2. The apparatus of claim 1, further including:

a saturation circuit having inputs coupled to the flag and the overflow detector, and an output coupled to the shifter unit.

3. The apparatus of claim 1, wherein the overflow detector includes an XOR circuit.

4. The apparatus of claim 1, wherein the shifter unit is a shift register.

5. The apparatus of claim 1, wherein the flag is a shift register.

6. A method of performing a left-shift operation, comprising:

a. loading a value to be shifted into a shifter unit, the shifter unit having a first left-most bit containing sign bit information for the value to be shifted, and a second bit adjacent to the first bit;

b. shifting the value by one bit to the left;

c. comparing the data in the first and second bits; and d. setting an overflow condition if the data in the first and second bits are not the same.

7. The method of claim 6, wherein the step of comparing the data in the first and second bits is performed by an XOR operation of the data in the first and second bits.

8. The method of claim 6, further including:

providing the sign bit information to a flag; and providing the sign bit information from the flag to an overflow detector.

9. The method of claim 6, further including:

repeating steps (b) and (c) if the data in the first and second bits are the same.

10. The method of claim 8, wherein the step of setting an overflow condition further includes:

checking the sign bit; and setting the value in the shifter unit to be either a minimum or a maximum value depending on the sign bit information.

11. A method of performing a left-shift operation, comprising:

a. loading a value to be shifted into a shifter unit, the shifter unit having a first left-most bit containing sign bit information for the value to be shifted, and a second bit adjacent to the first bit;

b. shifting the value by one bit to the left;

c. comparing the data in the first and second bits;

d. setting an overflow condition if the data in the first and second bits are not the same;

e. checking the sign bit; and f. setting the value in the shifter unit to be either a minimum or a maximum value depending on the sign bit information.

* * * * *